(12) United States Patent
Fujita et al.

(10) Patent No.: US 8,279,669 B2
(45) Date of Patent: Oct. 2, 2012

(54) SEMICONDUCTOR STORAGE DEVICE TO CORRECT THRESHOLD DISTRIBUTION OF MEMORY CELLS BY REWRITING AND METHOD OF CONTROLLING THE SAME

(75) Inventors: Norihiro Fujita, Yokohama (JP); Yasuyuki Fukuda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 12/855,243

(22) Filed: Aug. 12, 2010

(65) Prior Publication Data
US 2011/0038206 A1 Feb. 17, 2011

(30) Foreign Application Priority Data
Aug. 13, 2009 (JP) ................................. 2009-187825

(51) Int. Cl.
*G11C 16/04* (2006.01)
(52) U.S. Cl. .......... 365/185.03; 365/185.17; 365/185.24
(58) Field of Classification Search ............. 365/185.03, 365/185.17, 185.24
See application file for complete search history.

(56) References Cited

U.S. PATENT DOCUMENTS

| 7,372,744 B2 * | 5/2008 | Shiga et al. .............. 365/189.05 |
| 7,589,999 B2 * | 9/2009 | Jeong et al. .............. 365/185.08 |
| 8,149,622 B2 * | 4/2012 | Lee et al. ................. 365/185.18 |
| 2008/0019176 A1 * | 1/2008 | Fujisawa et al. ......... 365/185.03 |

FOREIGN PATENT DOCUMENTS
JP 2005-25898 1/2005
* cited by examiner

*Primary Examiner* — Anh Phung
(74) *Attorney, Agent, or Firm* — Oblon, Spivak, McClelland, Maier & Neustadt, L.L.P.

(57) ABSTRACT

According to one embodiment, a semiconductor storage device includes a first cell, a second cell, a bit line, a first buffer, a second buffer, and a controller. The bit line transfers the data to the first cell and the second cell. The first buffer holds write data to the first cell and the second cell. The second buffer holds read data from the first cell. The controller controls first writing and rewriting executed for the first cell and second writing executed for the second cell. The write data in the first buffer is updated each time a second write signal is given. The controller executes the first writing based on the write data held by the first buffer. The controller performs the second writing based on the write data updated in the first buffer. The controller executes the rewriting based on the read data held by the second buffer.

10 Claims, 6 Drawing Sheets

SEMICONDUCTOR STORAGE DEVICE TO CORRECT THRESHOLD DISTRIBUTION OF MEMORY CELLS BY REWRITING AND METHOD OF CONTROLLING THE SAME

CROSS-REFERENCE TO RELATED APPLICATIONS

This application is based upon and claims the benefit of priority from Japanese Patent Application No. 2009-187825, filed Aug. 13, 2009; the entire contents of which are incorporated herein by reference.

FIELD

Embodiments described herein relate generally to a semiconductor storage device such as a NAND flash memory and a method of controlling the same.

BACKGROUND

Data held by a memory cell is more and more becoming multi-level data in semiconductor storage devices such as the NAND flash memory. Therefore, it is required to narrow the threshold distribution of each memory cell.

Also, recently, a space between adjacent memory cells becomes narrower in accordance with such minimization. As a result, when writing data, for example, due to an effect of the adjacent memory cell, a threshold varies. This causes breakage and misreading of the data.

Also, when the threshold distribution of the memory cells becomes higher than an initial one due to the variation of the threshold, it becomes necessary to raise a voltage to be transferred to a non-selected word line WL at the time of data reading. This is regarded as a factor leading to degradation of the semiconductor storage device, and causes read disturb.

Therefore, in order to minimize the effect of the adjacent memory cell, the threshold distribution of the memory cells is adjusted by various writing methods that take into account an effect of the threshold.

However, when the threshold distribution is adjusted, the design of a controller and the like needs to be changed and a circuit area of the controller becomes larger.

Also, it is disclosed in Jpn. Pat. Appln. KOKAI Publication No. 2005-25898 that the threshold adjustment between the adjacent memory cells in a bit line direction is not sufficient even when the threshold distribution of the memory cells may be adjusted between the memory cells in a word line direction.

DETAILED DESCRIPTION

Hereinafter, an embodiment is described with reference to the drawings. In this description, common reference numerals are given to common parts throughout the drawings.

In general, according to one embodiment, a semiconductor storage device includes a first memory cell, a second memory cell, a bit line, a first buffer, a second buffer, and a controller. The first memory cell and a second memory cell each includes a charge accumulating layer and a control gate, and holds two or more-level data. The second memory cell is adjacent to the first memory cell. The bit line transfers the data to the first memory cell and the second memory cell. The first buffer is connected to the bit line and holds write data to the first memory cell and the second memory cell. The second buffer is connected to the bit line and holds read data from the first memory cell. The controller controls first writing and rewriting executed for the first memory cell connected to the bit line and second writing executed for the second memory cell. The write data in the first buffer is updated each time a second write signal is given. The controller executes the first writing based on the write data held by the first buffer. The controller reads the data from the first memory cell when the second write signal is transferred to allow the second buffer to hold the read data. The controller performs the second writing based on the write data updated in the first buffer. The controller executes the rewriting to correct a threshold distribution of the first memory cell based on the read data held by the second buffer.

[First Embodiment]

Figure 1:
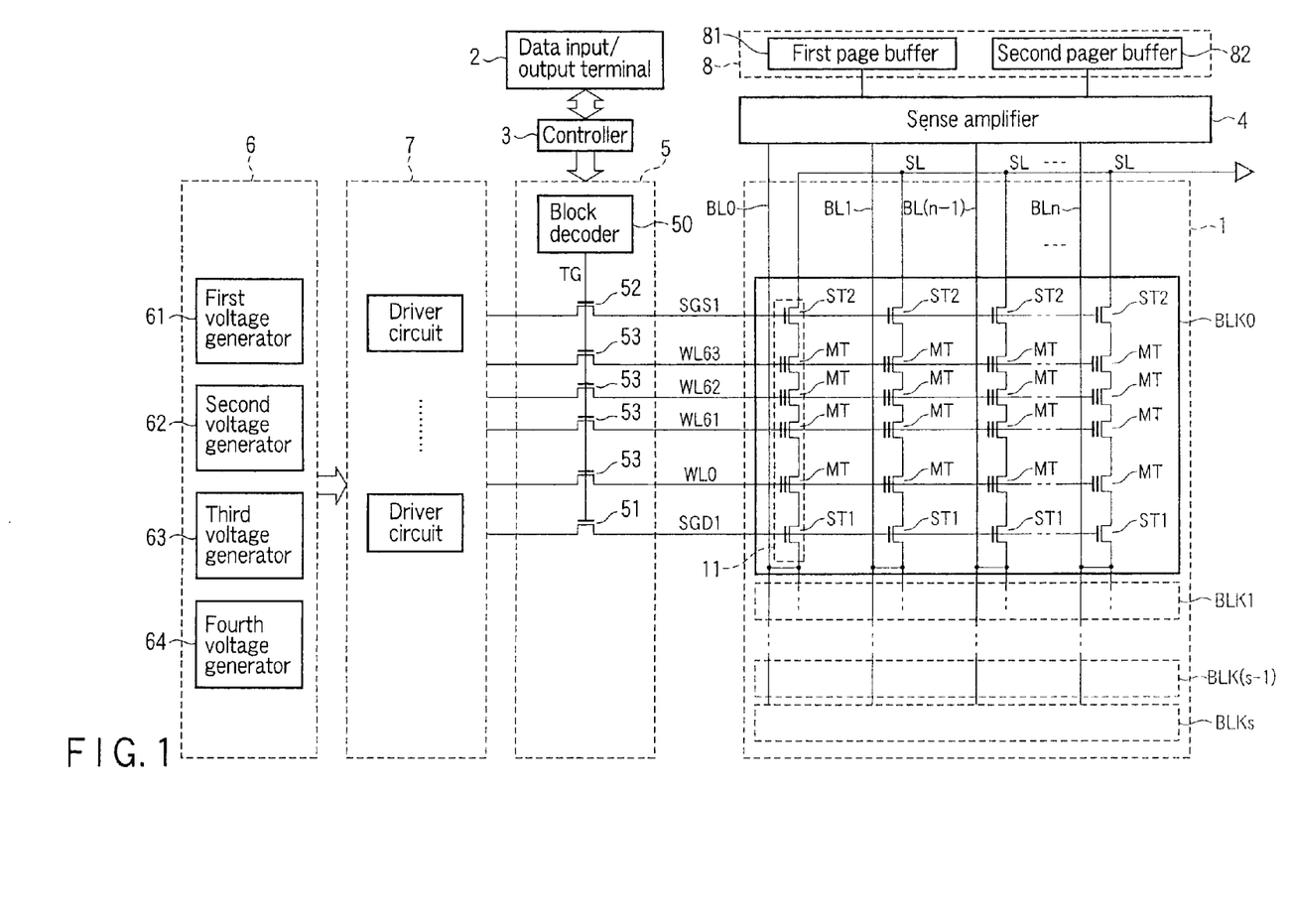
FIG. 1 is an overall view of a NAND flash memory according to a first embodiment.

A NAND flash memory is described as an example of a nonvolatile semiconductor device according to a first embodiment. FIG. 1 shows an entire structure of the NAND flash memory.

<Entire Structure>

As illustrated in FIG. 1, the NAND flash memory comprises a memory cell array 1, a data input/output terminal 2, a controller 3, a sense amplifier 4, a row decoder 5, a voltage generator 6, a driver circuit 7, and a buffer circuit 8. The memory cell array 1 is described first.

<Memory Cell Array 1>

The memory cell array 1 comprises a plurality of nonvolatile memory cell transistors MT capable of holding the data. Each of the memory cell transistors MT is an n-channel MOS transistor comprising a stacked gate including the charge accumulating layer and the control gate, for example. The control gate of the memory cell transistor MT serves as a word line WL, a drain thereof is electrically connected to a bit line BL, and a source thereof is electrically connected to a source line SL. The memory cell array 1 comprises blocks BLK0 to BLKs (s is a natural number) each including the plurality of nonvolatile memory cell transistors MT.

Each of the blocks BLK0 to BLKs comprises a plurality of NAND strings 11 in which the nonvolatile memory cell transistors MT are connected in series, as illustrated in FIG. 1. Each of the NAND strings 11 includes 64 memory cell transistors MT and selection transistors ST1 and ST2, for example.

The memory cell transistor MT has a floating gate (FG) structure comprising the charge accumulating layer (conductive body, for example) formed on a semiconductor substrate with a gate insulating film interposed therebetween, an interlayer insulating film formed on the charge accumulating layer, and a control gate electrode formed on the interlayer insulating film.

Meanwhile, the memory cell transistor MT may have a MONOS structure comprising the charge accumulating layer (insulating film, for example) formed on the semiconductor substrate with the gate insulating film interposed therebetween, an insulating film with a permittivity higher than that of the charge accumulating layer (hereinafter, referred to as a block layer) formed on the charge accumulating layer, and the control gate electrode formed on the block layer.

Note that the number of the memory cell transistors MT is not limited to 64, and this may be 128, 256, 512 and the like, and the number is not limited. Adjacent memory cell transistors MT share the source and the drain. Current paths of the memory cell transistors MT are arranged so as to be connected in series between the selection transistors ST1 and ST2. A drain area on one end side of the memory cell transistors MT connected in series is connected to a source area of the selection transistor ST1, and a source area on the other end side is connected to a drain area of the selection transistor ST2.

The control gate electrodes of the memory cell transistors MT on the same row are connected in common to any one of word lines WL0 to WL63, and gate electrodes of the selection transistors ST1 and ST2 of the memory cell transistors MT on the same column are connected in common to select gate lines SGD1 and SGS1, respectively. In order to simplify the description, the word lines WL0 to WL63 are hereinafter sometimes simply referred to as the word line WL when they are not distinguished from one another. In the memory cell array 1, drains of the selection transistors ST1 of the same column are connected in common to any one of bit lines BL0 to BLn. Hereinafter, as for the bit lines BL0 to BLn (n is a natural number) also, they are collectively referred to as the bit line BL when they are not distinguished from one another. Sources of the selection transistors ST2 are connected in common to the source line SL.

Data is collectively written in the plurality of memory cell transistors MT connected to the same word line WL, and this unit is referred to as a page. Further, the data is collectively erased in a block BLK unit in the plurality of NAND strings 11.

<Regarding the Threshold Distribution of Memory Cell Transistors MT>

Figure 2:
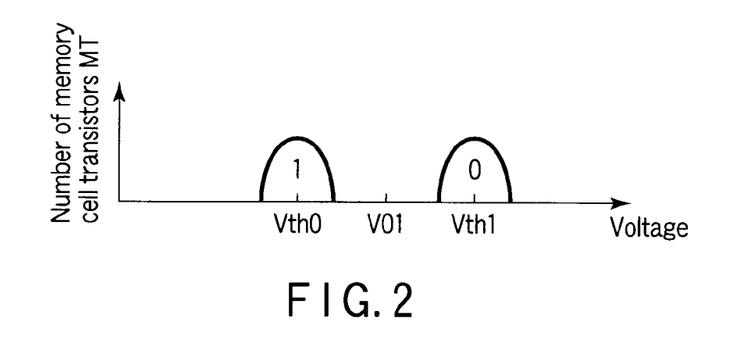
FIG. 2 shows a threshold distribution of memory cell transistors according to the first embodiment.

Next, the threshold distribution of the above-described memory cell transistors MT is described with reference to FIG. 2. FIG. 2 is a graph in which the threshold distribution and the number of the memory cell transistors MT are represented along an abscissa axis and an ordinate axis, respectively.

As illustrated in FIG. 2, each of the memory cell transistors MT may hold the two-level data (one-bit data), for example. That is, the memory cell transistor MT may hold two types of data, which are "1" and "0", in ascending order of a threshold voltage Vth.

A threshold voltage Vth0 of the "1" data in the memory cell transistor MT is the threshold voltage in an erased state and expressed as Vth0<V01 (=0 V), that is, a negative voltage. A threshold voltage Vth1 of the "0" data is expressed as V01<Vth1. In this manner, it is assumed that the memory cell transistor MT may hold the one-bit data, which are the "0" data and the "1" data, according to the threshold. The threshold voltage varies due to injection of charge into the charge accumulating layer. Also, the above-described memory cell transistor MT may be capable of holding four or more-level data.

<Regarding Data Input/Output Terminal 2>

The data input/output terminal 2 is described with reference to FIG. 1 again.

Various commands (write signal, read signal), an address signal, and the write data are supplied from a host device (not illustrated) to the data input/output terminal 2 through an I/O terminal (not illustrated).

When writing the data, the write data is supplied from the data input/output terminal 2 through a data line (not illustrated) and the buffer circuit 8 to the sense amplifier 4.

When reading the data, the data read from the sense amplifier 4 to the buffer circuit 8 is supplied to the data input/output terminal 2 through the data line (not illustrated). Next, the read data is output from the data input/output terminal 2 to the host device (not illustrated).

The address signal supplied from the data input/output terminal 2 is supplied to an address decoder (not illustrated). The signal decoded by the address decoder is supplied to the row decoder 5 and the sense amplifier 4.

Further, the command supplied from the data input/output terminal 2 is supplied to the controller 3. An external control signal such as a chip enable signal/CE, a write enable signal/WE, a read enable signal/RE, an address latch enable signal ALE, and a command latch enable signal CLE is supplied from a host (not illustrated) to the controller 3.

<Regarding Controller 3>

The controller 3 controls the operation of an entire NAND flash memory. That is, the controller 3 executes an operation sequence of a write operation, read operation, and erase operation of the data based on the above-described address and command given from the host (not illustrated) through the data input/output terminal 2.

The controller 3 executes a write operation sequence to the word line WLn based on the above-described command. Thereafter, when the controller 3 receives the write signal for the memory cell transistor MT connected to the word line WL (n+1) from the host, the controller 3 first executes a write verify operation sequence to the memory cell transistor MT connected to the word line WLn. The data read by the verify operation is stored in a second page buffer 82 and the data in a first page buffer 81 is updated.

Thereafter, the write operation sequence of the data is generated in the memory cell transistor MT connected to the word line WL(n+1). The voltage generator 6 to be described later generates a desired voltage and transfers the same to the word line WL in response to the operation sequences. The voltage generated by the voltage generator 6 is to be described separately.

Also, the controller 3 generates a block selection signal/column selection signal based on the above-described address and operation sequence. The controller 3 outputs the block selection signal to the row decoder 5. The block selection signal is the signal with which the row decoder 5 selects any one of a plurality of memory blocks BLK0 to BLKs when reading, writing, and erasing the data. Also, the controller 3 outputs the column selection signal to the sense amplifier 4. The column selection signal is the signal to select a column direction.

<Regarding Sense Amplifier 4>

The sense amplifier 4 senses and amplifies the data read from the memory cell transistor MT to the bit line BL when reading the data. The sense amplifier 4 serves as a current-detecting type amplifier in this embodiment. That is, the sense amplifier 4 senses the current which the memory cell transistor MT included in the NAND string 11 passes through the bit line BL. That is, the sense amplifier 4 directly senses the current, which the memory cell transistor MT passes, while keeping the voltage of the bit line BL constant. The current of the bit line BL is determined by the data held by the memory cell transistor MT. Therefore, judgment of "1" or "0" by the sense amplifier 4 connected to the bit line BL is finally determined by a difference in the value of the current which the memory cell transistor MT passes.

Also, when writing the data, the sense amplifier 4 transfers the data, transferred from the host (not illustrated) through the buffer circuit 8, to the bit line BL. When the write data is the "0" data, the sense amplifier 4 lowers the potential of the bit line BL to 0 [V]. That is, a write voltage VPGM transferred to the word line WL becomes the potential difference between the word line WL and the gate insulating film. Also, when the write data is the "1" data, the sense amplifier 4 keeps the potential of the bit line BL constant and makes the voltage difference between the word line WL and the bit line BL smaller than that when writing the "0" data.

<Regarding Row Decoder 5>

The row decoder 5 comprises a block decoder 50 and n-channel MOS transistors 51 to 53. The block decoder 50 decodes a block address given from the controller 3 at the time of the write operation, the read operation and the erasing of the data. The block decoder 50 selects the block BLK based on a decoded result. That is, the block decoder 50 selects the MOS transistors 51 to 53 corresponding to the block BLK including the selected memory cell transistor MT through a control line TG and turns on the MOS transistors 51 to 53. At this time, the block selection signal is output from the block decoder 50. The block selection signal is the signal with which the row decoder 5 selects any one of the plurality of memory blocks BLK0 to BLKs when reading, writing and erasing the data. According to this, the row decoder 5 selects a row direction of the memory cell array 1 corresponding to the selected block BLK. That is, the row decoder 5 applies the voltage given from the voltage generator 6 through the driver circuit 7 to the select gate lines SGD1 and SGS1 and the word lines WL0 to WL63 based on the selection signal given from the block decoder 50.

<Regarding Voltage Generating Circuit 6>

The voltage generator 6 comprises a first voltage generator 61, a second voltage generator 62, a third voltage generator 63, and a fourth voltage generator 64. The first to fourth voltage generators 61 to 64 are illustrated with reference to FIG. 3.

Figure 3:
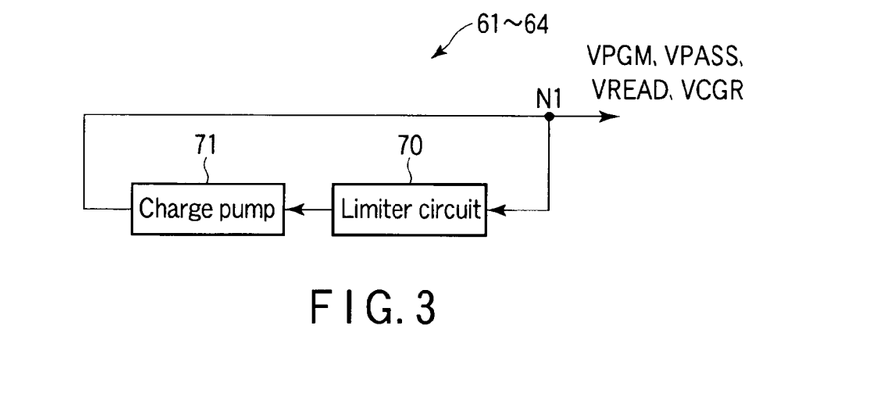
FIG. 3 is a block diagram of a voltage generator according to the first embodiment.

As illustrated in FIG. 3, each of the first to fourth voltage generators 61 to 64 comprises a limiter circuit 70 and a charge pump circuit 71. The charge pump circuit 71 is controlled by the controller 3 to generate a voltage required for the write operation, the erase operation and the read operation of the data, for example. Each of the above-described generated voltages is output from a node N1 to be supplied to the word line WL through the driver circuit 7 and the row decoder 5. The limiter circuit 70 controls the charge pump circuit 71 according to the potential of the node N1 while monitoring the potential of the node N1. That is, when the potential of the node N1 is higher than a predetermined value, the limiter circuit 70 stops pumping the charge pump circuit 71 to lower the potential of the node N1.

On the other hand, when the potential of the node N1 is lower than the predetermined value, the limiter circuit 70 controls the charge pump circuit 71 to pump, thereby raising the potential of the node N1.

Next, the voltage generated by the above-described first to fourth voltage generators 61 to 64 is described.

The first voltage generator 61 generates a voltage VREAD when reading the data and transfers the voltage VREAD to a non-selected word line. The voltage VREAD is the voltage to turn on the memory cell transistor MT regardless of the held data.

The second voltage generator 62 generates a voltage VCGR when reading data and transfers the voltage VCGR to a selected word line WL. The voltage VCGR is the voltage corresponding to the data to be read from the memory cell transistor MT. The voltage VCGR is also used as a write verify voltage. That is, a desired write verify voltage is set by setting the voltage VCGR to a certain value.

It is confirmed that the threshold voltage of the memory cell transistor MT is lower than the set write verify voltage when the memory cell transistor MT is turned on by the voltage VCGR.

Conversely, it is confirmed that the threshold voltage is higher than the verify voltage when the memory cell transistor MT is turned off.

The write verify voltage is controlled by the limiter circuit 70. That is, it is possible to separately set the write verify voltage according to the threshold distribution of the memory cell transistors MT.

The third voltage generator 63 generates a desired write voltage when writing the data and transfers the write voltage to the selected word line WL. Specifically, the third voltage generator 63 generates voltages $VPGM_0$, $VPGM_2$, and $VPGM_3$ and transfers the voltages to the memory cell transistor MT through the word line WL. Each of the voltages $VPGM_0$, $VPGM_2$, and $VPGM_3$ is the voltage of a magnitude at which the charge generated in a channel area of the memory cell transistor MT is injected into the charge accumulating layer, and the threshold of the memory cell transistor MT makes transition to another level. Also, the voltages $VPGM_0$, $VPGM_2$, and $VPGM_3$ may be the same value. In this case, a write time to the memory cell transistor MT only needs to be changed. The voltage $VPGM_0$ is the voltage required when writing any one of the "1" data and the "0" data. That is, whether the "1" data or the "0" data is written in the memory cell transistor MT depends on the potential of the bit line BL.

The voltage $VPGM_2$ is the voltage required when writing "2" data, for example, in a case of multi-level. The voltage $VPGM_3$ is the voltage required when writing "3" data, for example, in the case of the multi-level. The $VPGM_0$ is the voltage at which the threshold voltage of the memory cell transistor MT is higher than the voltage V01 and lower than the threshold Vth1 in FIG. 2. That is, the third voltage generator 63 adjusts the threshold voltage of the memory cell transistor MT by transferring the voltage which is higher than the voltage V01 but lower than an initial value in FIG. 2 to the memory cell transistor MT.

Also, the third voltage generator 63 transfers a rewrite voltage $VPGM_{rev1}$ to the memory cell transistor MT, which holds the "1" data, as the write voltage to correct the threshold distribution of the adjacent memory cell transistors MT affected by variation of the threshold distribution of the adjacent memory cell transistors MT, and transfers a rewrite voltage $VPGM_{rev0}$ higher than the rewrite voltage $VPGM_{rev1}$ to the word line WL in the memory cell transistor MT, which holds the "0" data. This is the case in which the memory cell transistor MT holds the two-level data.

Next, the voltage generated by the third voltage generator 63 when the memory cell transistor MT holds the four-level data, for example, is described.

It is assumed that the memory cell transistor MT holds the "2" data or the "3" data, for example, by the above-described voltages $VPGM_2$ and $VPGM_3$.

In this case, the third voltage generator 63 transfers a rewrite voltage $VPGM_{rev2}$ to the memory cell transistor MT, which holds the "2" data.

Also, a rewrite voltage $VPGM_{rev3}$ higher than the rewrite voltage $VPGM_{rev2}$ is transferred to the word line WL in the memory cell transistor MT, which holds the "3" data.

A magnitude of each of the above-described write voltages $VPGM_0$, $VPGM_2$, and $VPGM_3$ and the rewrite voltages $VPGM_{rev0}$, $VPGM_{rev1}$, $VPGM_{rev2}$, and $VPGM_{rev3}$ is controlled by the limiter circuit 70. When the above-described various voltages are not distinguished from one another, they are simply referred to as the voltage VPGM. Also, the voltages $VPGM_{rev0}$, $VPGM_{rev1}$, $VPGM_{rev2}$, and $VPGM_{rev3}$ may be the same value. In this case, the write time to the memory cell transistor MT only needs to be changed.

Meanwhile, the voltages $VPGM_2$, $VPGM_3$, $VPGM_{rev2}$, and $VPGM_{rev3}$ are described in a second embodiment.

The fourth voltage generator 64 transfers a voltage VPASS. The voltage VPASS is the voltage at which the memory cell transistor MT is turned on. Meanwhile, when the above-described first to fourth voltage generators 61 to 64 are not distinguished from one another, they are simply referred to as the voltage generator 6.

<Regarding Driver Circuit 7>

Herein, the driver circuit 7 is functionally described. The driver circuit 7 transfers the various voltages transferred from the above-described voltage generator 6 to the row decoder 5 as needed. That is, the driver circuit 7 decodes the address signal supplied from the controller 3 and transfers the above-described various voltages to the row decoder 5 based on the decoded result.

<Regarding Buffer Circuit 8>

Next, the buffer circuit 8 is described. As illustrated in FIG. 1, the buffer circuit 8 comprises the first page buffer 81 and the second page buffer 82. The first page buffer 81 may hold the data per page of the above-described memory cell array 1. For example, when there is the write signal from the controller 3, the first page buffer 81 transfers the held data to the sense amplifier 4. Also, the first page buffer 81 holds write permission data, that is, "0" when performing the rewrite operation to the memory cell transistors MT per page.

Also, when reading the data, the data read from the memory cell array 1 is held once by the first page buffer 81 through the sense amplifier 4 and thereafter transferred to the data input/output terminal 2 through the data line (not illustrated).

The second page buffer 82 may hold the data written in the memory cell transistor MT according to the data of the above-described first page buffer 81. That is, the data written in the memory cell transistor MT corresponding to the word line WLn is stored in the second page buffer 82 by an instruction from the controller 3, for example. According to this, the above-described controller 3 may confirm a state of the threshold distribution of the memory cell transistors MT corresponding to the word line WLn in which the data is written.

<Regarding Write Operation of NAND Flash Memory>

Figure 4:
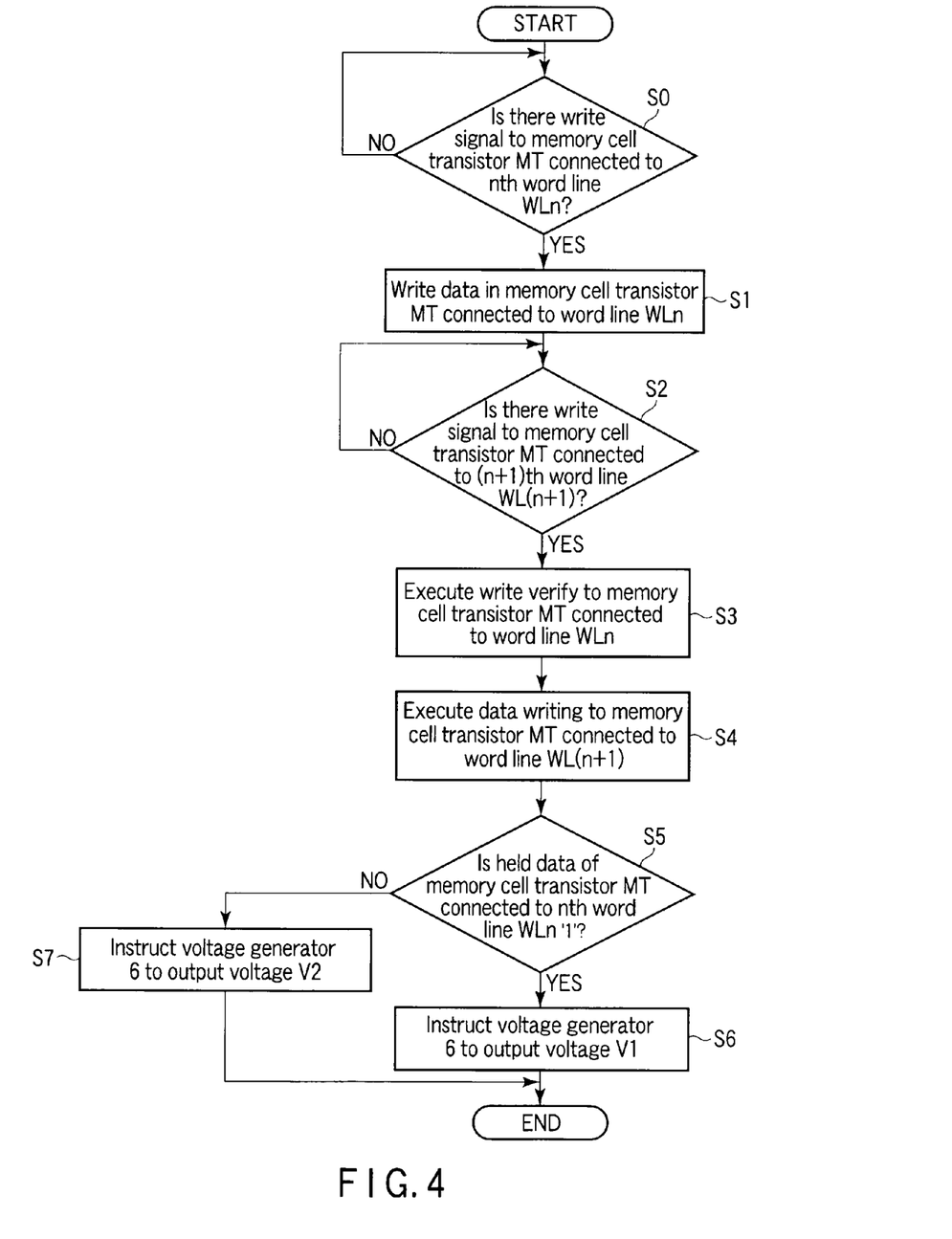
FIG. 4 is a flow chart of a controller according to the first embodiment.

Next, the write operation of the two-level data by the NAND flash memory according to the above-described configuration is described with reference to FIG. 4. FIG. 4 is a flow chart of the write operation of the NAND flash memory at the time of the write operation.

First, the controller 3 judges whether there is the data write signal to the word line WLn (step S0). As a result of the judgment, when the controller 3 receives the write signal from the host (not illustrated) (S0, YES), the controller 3 supplies the address signal corresponding to the memory cell transistor MT to the driver circuit 7. Also, the controller 3 controls the third voltage generator 63 to generate the voltage $VPGM_0$.

The write voltage $VPGM_0$ generated by the third voltage generator 63 is transferred through the driver circuit 7, which has decoded the above-described address signal, to the word line WLn.

In this manner, the write data and the write signal are given to the NAND flash memory. That is, at step S0, when the write signal is received from the host (not illustrated) (step S0, YES), the write data is stored in the first page buffer 81 and supplied from the first page buffer 81 to the sense amplifier 4. Thereafter, the potential of the bit line BL is set according to the write data and the write voltage $VPGM_0$ is applied to the selected word line WL. Therefore, the data is written in a page unit in the memory cell transistors MT connected in common to the word line $WLn_1$ (S1). That is, when the potential of the bit line BL is 0[V], the threshold voltage of the memory cell transistor MT is increased, and when the potential of the bit line BL is at a high level, the threshold voltage of the memory cell transistor MT does not change. That is, the threshold voltage remains as the data "1" in the erased state.

Next, the controller 3 judges whether there is the data write signal to the word line WL (n+1). As a result, when there is the data write signal from the host (not illustrated) to the word line WL (n+1) (S2, YES), the controller 3 first controls the driver circuit 7 to execute the write verify of the data of the memory cell transistor MT connected to the word line WLn (S3). Also, the data in the first page buffer 81 is updated. That is, new write data is stored in the first page buffer 81.

At step S3, the controller 3 controls the second voltage generator 62 to generate the voltage VCGR. According to this, the driver circuit 7 transfers the voltage VCGR generated by the second voltage generator 62 to the word line WLn. Herein, when the data included in the memory cell transistor MT is the two-level data, the voltage VCGR is set to 0 [V], for example. In this verify operation, after the bit line BL is pre-charged to the high level, the data of the memory cell transistor MT is read by using the voltage VCGR. As a result, when the threshold voltage of the memory cell transistor MT is higher than the voltage VCGR, the memory cell transistor MT is turned off. Therefore, the potential of the bit line BL is held at the high level.

On the other hand, when the threshold voltage of the memory cell transistor MT is lower than the voltage VCGR, the memory cell transistor MT is turned on and the potential of the bit line BL is set to a low level.

In this manner, the data held by the memory cell transistor MT connected to the word line WLn is set and transferred to the second page buffer 82 through the sense amplifier 4. As a result, when the data "1" (erased state) is written in the memory cell transistor MT, the data "1" is held by the second page buffer 82.

Meanwhile, in this case, the voltage VREAD generated by the first voltage generator 61 is transferred to the non-selected word line WL. According to this, the controller 3 may confirm the data of one page of the memory cell transistor MT connected to the word line WLn.

After the above-described verify operation, the data stored in the first page buffer 81 is written in the memory cell transistor MT connected to the word line WL (n+1) (S4). Next, the controller 3 stores the "0" data in the first page buffer 81.

Next, the data stored in the second page buffer 82, that is, the data of the memory cell transistor MT connected to the word line WLn is judged.

As a result, the controller 3 controls the third voltage generator 63, which generates the rewrite voltage $VPGM_{rev1}$ of the data "1" when the stored data is the "1" data (S5, YES) and generates the rewrite voltage $VPGM_{rev0}$ of the data "0" when the data is the "0" data (S6). According to this, the voltages $VPGM_{rev0}$ and $VPGM_{rev1}$ are transferred to the word line WLn through the driver circuit 7 and the row decoder 5.

On the other hand, at step S5, when the data held by the second page buffer 82 is "0" (S5, NO), the controller 3 controls the third voltage generator 63 to transfer the voltage $VPGM_{rev0}$ (>voltage $VPGM_{rev1}$) higher than 0 [V] (S7). According to this, the voltage $VPGM_{rev0}$ is transferred to the word line WLn through the driver circuit 7 and the row decoder 5.

Also, when there is the memory cell transistor MT to which the voltages $VPGM_{rev0}$ and $VPGM_{rev1}$ should be transferred in the word line WLn, the third voltage generator 63 transfers the voltage to the word line WLn while increasing the voltage from the voltage $VPGM_{rev1}$ to the voltage $VPGM_{rev0}$.

Meanwhile, the values of the voltages $VPGM_{rev0}$ and $VPGM_{rev1}$ are set to the values corresponding to the threshold voltage of the memory cell transistor MT to which the rewriting should be performed. According to this, the threshold distribution on a low voltage side of the memory cell transistors MT to be described later is shifted (narrowed) to a high voltage side.

<Regarding Specific Example of Write Operation>

Figure 5:
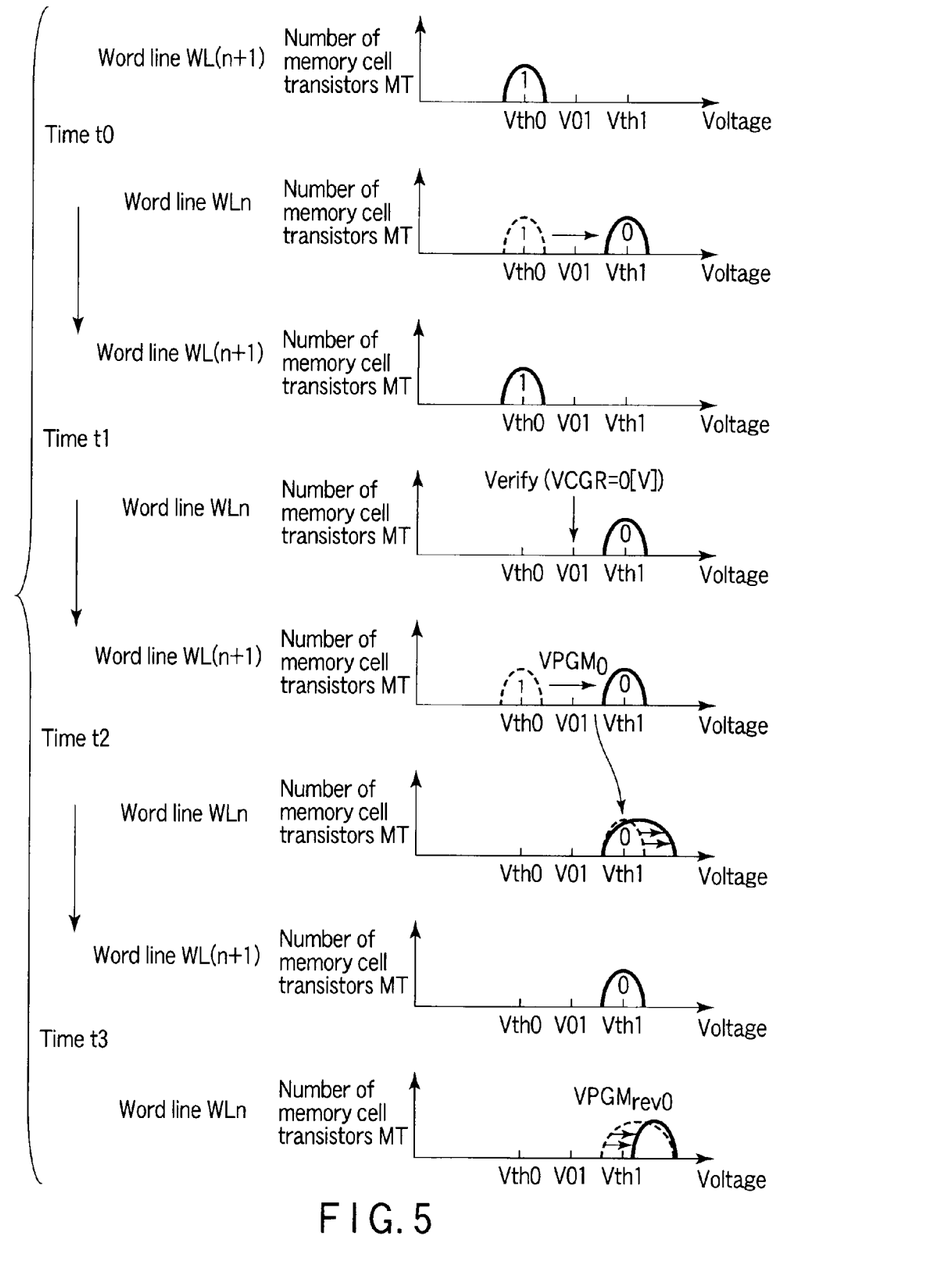
FIG. 5 is a time chart when writing "0" in a memory cell transistor MTn in the NAND flash memory according to the first embodiment.
Figure 6:
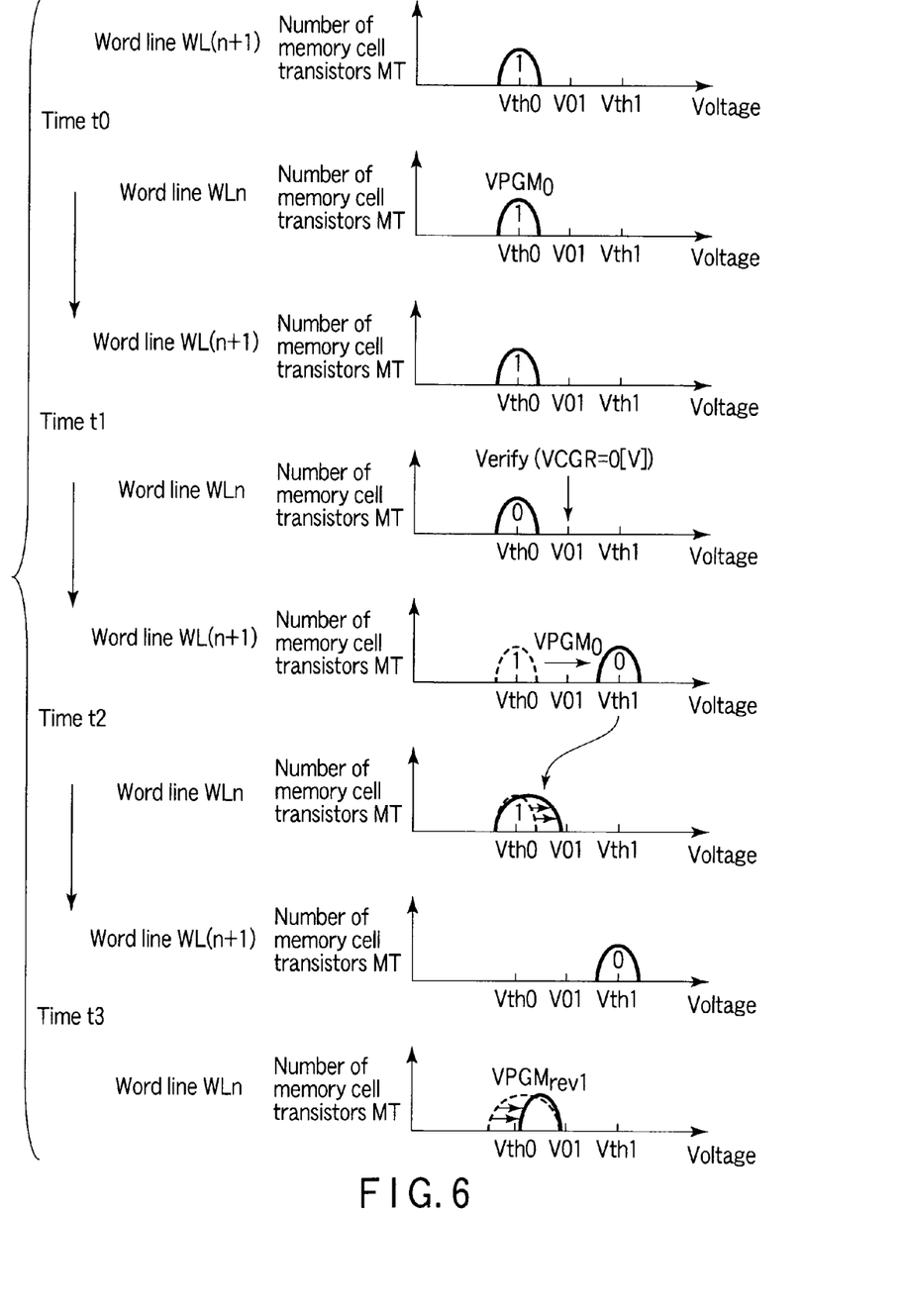
FIG. 6 is a time chart when writing "1" in the memory cell transistor MTn in the NAND flash memory according to the first embodiment.

Next, a specific example of the write operation to the memory cell transistor MT connected to the word line WLn in the semiconductor storage device according to this embodiment is described by separately describing a case of writing the "1" data and a case of writing the "0" data, with reference to FIGS. 5 and 6.

FIGS. 5 and 6 are time charts illustrating change in the threshold distribution of the memory cell transistors MT connected to the word lines WLn and WL (n+1) with time when writing the "1" data or the "0" data in the memory cell transistor MT connected to the word line WLn.

First, a case in which the "0" data is written in all of the memory cell transistors MT connected to the word line WLn is described with reference to FIG. 5. That is, the second page buffer 82 holds the data written in the memory cell transistor MT, that is, the "0" data by the verify operation. That is, "0" is stored as all of the data of one page in the second page buffer 82.

A description is given next focusing on the memory cell transistor MT formed on an intersection of the word line WLn and the bit line BLn, and on an intersection of the word line WL (n+1) and the bit line BLn (hereinafter, the memory cell transistor MT connected to the word line WLn is referred to as a memory cell transistor MTn, and the memory cell transistor MT connected to the word line WL (n+1) is referred to as a memory cell transistor MT (n+1)). Further, in each case, the "0" data is written in the memory cell transistor MT (n+1).

<"0" Data Writing>

First, when there is the write signal to the memory cell transistor MTn at a time t0 (S0, YES), the controller 3 controls the third voltage generator 63 and the driver circuit 7 to transfer the write voltage $VPGM_0$ to the word line WLn. According to this, the voltage $VPGM_0$ generated by the third voltage generator 63 is transferred to the word line WLn through the driver circuit 7 and the row decoder 5. The sense amplifier 4 keeps the potential of the bit line BLn at a write permission voltage, that is, 0 [V] based on the data supplied from the first page buffer 81. According to this, voltage difference $VPGM_0$ is applied to the control gate and the channel area of the memory cell transistor MT. As a result, the "0" data is written in the memory cell transistor MTn (S1). At this time, the voltage VPASS generated by the first voltage generator 61 is transferred to the non-selected word line WL. Therefore, the data is not written in a non-written memory cell transistor MT.

<Time t1>

Next, when there is the write signal to the memory cell transistor MT (n+1) at a time t1 (S2, YES), new data is stored in the first page buffer 81 from the host (not illustrated), and the controller 3 controls the driver circuit 7 to perform the write verify of the memory cell transistor MTn to which the writing is performed at the time t0. Then, the voltage VCGR (0 [V]) generated by the second voltage generator 62 is transferred to the word line WLn through the driver circuit 7 and the row decoder 5. The voltage VREAD is transferred to the non-selected word line WL by the fourth voltage generator 64. According to this, the NAND string 11 is turned off and the data of the read memory cell transistor MTn is transferred to the second page buffer 82.

<Time t2>

When the write verify to the memory cell transistor MTn is finished at the time t1, then the write voltage $VPGM_0$ is transferred to the word line WL (n+1) by the third voltage generator 63 at a time t2. The sense amplifier 4 keeps the potential of the bit line BLn at the write permission voltage, that is, 0 [V] based on the data held by the first page buffer 81 updated at the above-described time t1. The voltage VPASS generated by the fourth voltage generator 64 is transferred to the non-selected word line WL. According to this, the "0" data is written in the memory cell transistor MTn (S4). Then, with the threshold variation of the memory cell transistor MT (n+1), especially the high voltage side of the threshold distribution of the memory cell transistors MTn expands.

<Time t3>

Further, the controller 3 controls the driver circuit 7 to transfer the rewrite voltage $VPGM_{rev0}$, at a time t3, in order to correct (narrow) the threshold distribution of the memory cell transistors MTn expanded at the time t2. Also, as described above, since the "0" data is stored in the first page buffer 81, the potential of the bit line BL is set to 0 [V] at the time of rewriting.

Herein, since the threshold distribution of the memory cell transistors MTn is distributed on a positive side (S5, YES), the rewrite voltage $VPGM_{rev0}$ generated by the third voltage generator 63 is transferred to the word line WLn through the driver circuit 7 and the row decoder 5 (S7). Thereafter, the second voltage generator 62 transfers the voltage Vth1 as the voltage VCGR to the word line WLn to perform the write verify. The threshold distribution of the memory cell transistors MT is corrected (narrowed) and when the threshold voltage of the memory cell transistor MT is higher than the voltage Vth1, the memory cell transistor MT is turned off. Then, the correction is completed.

<"1" Data Writing (Non-Writing)>

Next, a case of performing the "1" data writing, that is, non-writing to all of the memory cell transistors MT connected to the word line WLn is described with reference to FIG. 6. That is, the second page buffer 82 holds the "1" data indicating the erased state by the verify operation. That is, "1" is stored as all of the data of one page in the second page buffer 82.

<Time t0>

As illustrated in FIG. 6, when there is the write signal to the memory cell transistor MTn at the time t0 (S0, YES), the controller 3 controls the third voltage generator 63 to generate the write voltage $VPGM_0$. Also, the controller 3 controls the driver circuit 7 to transfer the voltage $VPGM_0$ to the word line WLn.

According to this, the voltage $VPGM_0$ is transferred to the word line WLn through the driver circuit 7 and the row decoder 5. Also, the voltage VPASS generated by the fourth voltage generator 64 is transferred to the non-selected word line WL.

Next, the sense amplifier 4 keeps the potential of the bit line BLn at a write inhibition voltage based on the data supplied from the first page buffer 81. According to this, the non-writing ("1" data writing) is performed to the memory cell transistor MTn (S1). That is, the threshold voltage of the memory cell transistor MT is held at the threshold voltage in the erased state.

<Time t1>

Next, when there is the write signal to the memory cell transistor MT (n+1) at the time t1 (S2, YES), the new data is stored in the first page buffer 81 from the host (not illustrated) and the controller 3 controls the driver circuit 7 to perform the write verify of the memory cell transistor MTn to which the writing is performed at the time t0. Then, the voltage VCGR (0 [V]) generated by the second voltage generator 62 is transferred to the word line WLn through the driver circuit 7 and the row decoder 5.

Also, the first voltage generator 61 transfers the voltage VREAD to the non-selected word line WL. According to this, the NAND string 11 is turned on and the data of the memory cell transistor MTn read by the sense amplifier 4 is transferred to the second page buffer 82.

<Time t2>

When the write verify to the memory cell transistor MTn is finished at the time t1, then the write voltage $VPGM_0$ is transferred to the word line WL (n+1) by the third voltage generator 63 at the time t2. The sense amplifier 4 keeps the potential of the bit line BLn at the write permission voltage, that is, 0 [V] based on the data held by the first page buffer 81 updated at the above-described time t1. The voltage VPASS is transferred to the non-selected word line WL by the fourth voltage generator 64. According to this, the "0" data is written in the memory cell transistor MT (n+1) (S4). Then, with the threshold variation of the memory cell transistor MT (n+1), especially the high voltage side of the threshold distribution corresponding to the data "1" of the memory cell transistors MTn expands.

<Time t3>

Further, the controller 3 controls the third voltage generator 63 to generate the rewrite voltage $VPGM_{rev1}$ at the time t3 in order to correct (narrow) the threshold distribution of the memory cell transistors MTn expanded at the time t2. Also, as described above, since the "0" data is stored in the first page buffer 81, the potential of the bit line BL is set to 0 [V] at the time of the rewriting. The controller 3 further controls the driver circuit 7 to transfer the rewrite voltage $VPGM_{rev1}$ to the word line WLn.

Then, the rewrite voltage $VPGM_{rev1}$ generated by the third voltage generator 63 is transferred to the word line WLn through the driver circuit 7 and the row decoder 5. Herein, the rewrite voltage $VPGM_{rev1}$ generated by the third voltage generator 63 is the voltage to correct the threshold distribution as described above, and herein the voltage required to correct the threshold distribution of the memory cell transistors MTn expanded at the time t2. Also, since the threshold distribution of the memory cell transistors MTn is herein distributed on a negative side (S5, YES), the third voltage generator 63 transfers the voltage $VPGM_{rev1}$ at which the high voltage side of the memory cell transistor MTn does not exceed a verify point (voltage V01) in FIG. 6 (S6).

Thereafter, in order that the controller may perform the write verify, the second voltage generator 62 transfers the voltage Vth0 as the voltage VCGR to the word line WLn. The threshold distribution of the memory cell transistors MT is corrected (narrowed) and, when the threshold voltage of the memory cell transistor MT is higher than the voltage Vth0, the memory cell transistor MT is turned off. Then, the correction is completed. Herein, in order to generate the voltage Vth0, a positive voltage and 0 [V] are applied to the source side and the gate, respectively, thereby effectively setting the voltage Vth0 to the negative voltage.

Next, a method of transferring the above-described voltages (voltages $VPGM_{rev1}$ and $VPGM_{rev0}$) to the word line WL when the memory cell transistors MT, which hold the "0" data and the "1" data by the data writing, are connected to the word line WLn, that is, the same word line WL is described.

First, the potential of the bit line BL0 to the bit line BLn is set to the low level, that is, 0[V]. Next, the third voltage generator 63 transfers the voltage $VPGM_{rev1}$ to the word line WL. That is, the operation at the time t3 in FIG. 6 is executed. Thereafter, the verify operation is executed. That is, the second voltage generator 62 transfers the voltage Vth0 as the voltage VCGR to the word line WLn. As a result, when the memory, which holds the "1" data, is off, the potential of the bit line BL is set to the write inhibition voltage.

Next, the third voltage generator 63 transfers the voltage $VPGM_{rev0}$ to the word line WL. That is, the operation at the time t3 in FIG. 5 is executed. Thereafter, the verify operation is executed. That is, the voltage Vth1 is transferred to the word line WLn as the voltage VCGR. As a result, when the memory, which holds the "0" data, is off, the potential of the bit line BL is set to the write inhibition voltage.

Meanwhile, as described above, since the "0" data is held by the first page buffer 81 in the rewrite operation, the potential of the bit line BL is set to the write permission voltage, that is, 0 [V].

<Effect According to this Embodiment>

Effects (1) and (2) may be obtained by the semiconductor storage device and the method of controlling using the same according to this embodiment.

(1) Expansion of the circuit scale of the controller 3 may be suppressed.

In the semiconductor storage device according to this embodiment, when there is the write signal to the memory cell transistor MT (n+1) from the host (not illustrated), the controller 3 first generates a write verify operation sequence to the memory cell transistor MTn by itself. After the write verify operation to the memory cell transistor MTn, the write operation to the memory cell transistor MT (n+1) is executed. That is, in this case, even without redesigning to receive a write verify operation command from outside to the memory cell transistor MTn, the controller 3 generates the above-described verify sequence by itself, so that it is possible to instruct the memory cell array 1 of a new operation sequence without changing the design of the controller 3. This is not limited to improvement of operation reliability and suppression of expansion of the circuit scale described in the following effect (2), and a large effect may be realized on cost reduction of the circuit design.

(2) Operational reliability may be improved.

Further, in the semiconductor storage device according to this embodiment, the data written in the memory cell transistor MTn is held by the second page buffer 82. Therefore, the third voltage generator 63 may generate any one of appropriate rewrite voltages $VPGM_{rev0}$ and $VPGM_{rev1}$ based on the data. That is, the controller 3 may refer to the data of the second page buffer 82 to confirm the threshold distribution of the memory cell transistors MTn of interest. The data held by the second page buffer 82 is the data before the high voltage side of the threshold distribution of the memory cell transistors MTn expands. That is, the write verify is performed just before writing the data in the memory cell transistor MT (n+1). In this manner, the data held by the second page buffer 82 is the data which is not affected by the data writing to the adjacent memory cell transistor MT (n+1). According to this, even after the threshold distribution of the memory cell transistors MTn expands, the controller 3 may correct the same by the appropriate voltage for correcting the threshold distribution generated by the third voltage generator 63. According to this, the threshold distribution of the memory cell transistors MT may be narrowed.

In the semiconductor storage device according to this embodiment, the method of writing the data is the method in which all of the bit lines BL are selected by the sense amplifier 4 and the data is written in the memory cell transistors MT connected in common to the selected word line WL. That is, in this method, the threshold variation does not occur in the memory cell transistors MT adjacent in a direction of the word line WL at the time of the writing. That is, only the effect by the threshold variation of the memory cell transistor MT adjacent in a direction of the bit line BL should be considered. Therefore, in the semiconductor storage device according to this embodiment, the correction of the threshold of the memory cell transistor MTn is completed by the rewrite operation by the above-described third voltage generator 63.

Also, a problem that the rewrite voltage $VPGM_{rev0}$ higher than the rewrite voltage $VPGM_{rev1}$ is transferred by mistake to the memory cell transistor MT of the threshold distribution distributing on the negative side, for example, when transferring the rewrite voltage to the word line WLn does not occur. In other words, the data written by the write voltage $VPGM_0$ is not damaged by the rewrite voltage. In a case of the multi-level to be described hereinafter, a more effective effect may be obtained thereby.

[Second Embodiment]

Next, a semiconductor storage device and a method of controlling by using the same according to a second embodiment are described. In this embodiment, a case in which the memory cell transistor MT comprises multi-level data, for example, the four-level data is described.

The threshold distribution when the memory cell transistor MT comprises the four-level data is described with reference to FIG. 7.

Figure 7:
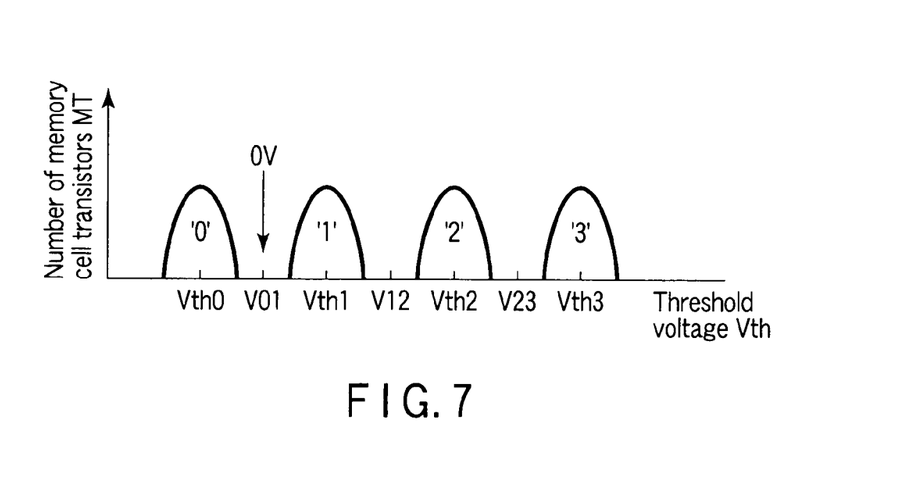
FIG. 7 shows a threshold distribution of the memory cell transistors MT according to a second embodiment.

As illustrated in FIG. 7, the threshold distribution is represented along the abscissa axis and the number of the memory cell transistors MT is represented along the ordinate axis. FIG. 7 illustrates a state in which the three threshold distributions are present on the positive side in FIG. 2. In this case, the memory cell transistor MT may hold any one of the values "1", "2", "3", and "4", and it is determined by an amount of electrons injected into the charge accumulating layer. That is, the memory cell transistor MT may hold four types of data, which are "1", "2", "3", and "4", in ascending order of the threshold voltage Vth. In this embodiment, the threshold voltage Vth0 of the "0" data in the memory cell transistor MT is expressed as Vth0<V01. The threshold voltage Vth1 of the "1" data in the memory cell transistor MT is expressed as V01<Vth1<V12. Hereinafter, similarly, the threshold voltage Vth2 of the "2" data is expressed as V12<Vth2<V23. The threshold voltage Vth3 of the "3" data is expressed as V23<Vth3.

For example, the above-described voltage V01 is set to 0[V]. Therefore, the threshold Vth0 of the "1" data is a negative value and the threshold voltages Vth1 to Vth3 of the "2" to "4" data are positive values. Out of the "1" to "4" data, a read level of the "1" data is set to the negative value and the read level of the "2" data or larger is set to the positive value. In the erased state, the threshold voltage of the memory cell transistor MT is set to Vth0. When reading the data, the voltage corresponding to the above-described read level is applied between the gate and the source of the memory cell transistor MT.

In this manner, the memory cell transistor MT may hold the two-bit data, which are the "1" to "4" data, according to the threshold.

Meanwhile, the read level to be set to 0 V is not limited to Vth1 but may be the voltage Vth2 or Vth3, and it is only required that at least one read level be the negative value. Also, the data, which may be held by the memory cell transistor MT, is not limited to the above-described four-level data. For example, the data may be eight-level data (three-bit data), 16-level data (four-bit data) or 32-level data (eight-bit data).

Also, the memory cell transistor MT may hold the multi-level data. Therefore, in order to store the multi-level data, the second page buffer 82 requires a plurality of areas. For example, when the data, which may be held by the memory cell transistor MT, is the four-level data, the second page buffer 82 comprises a buffer area 82-1, which holds a higher bit, and a buffer area 82-2, which holds a lower bit. That is, the second page buffer 82 comprises a plurality of buffer areas corresponding to the data, which may be held by the memory cell transistor MT (for example, t-level; t is a natural number not smaller than four).

<Regarding Write Operation>

Figure 8:
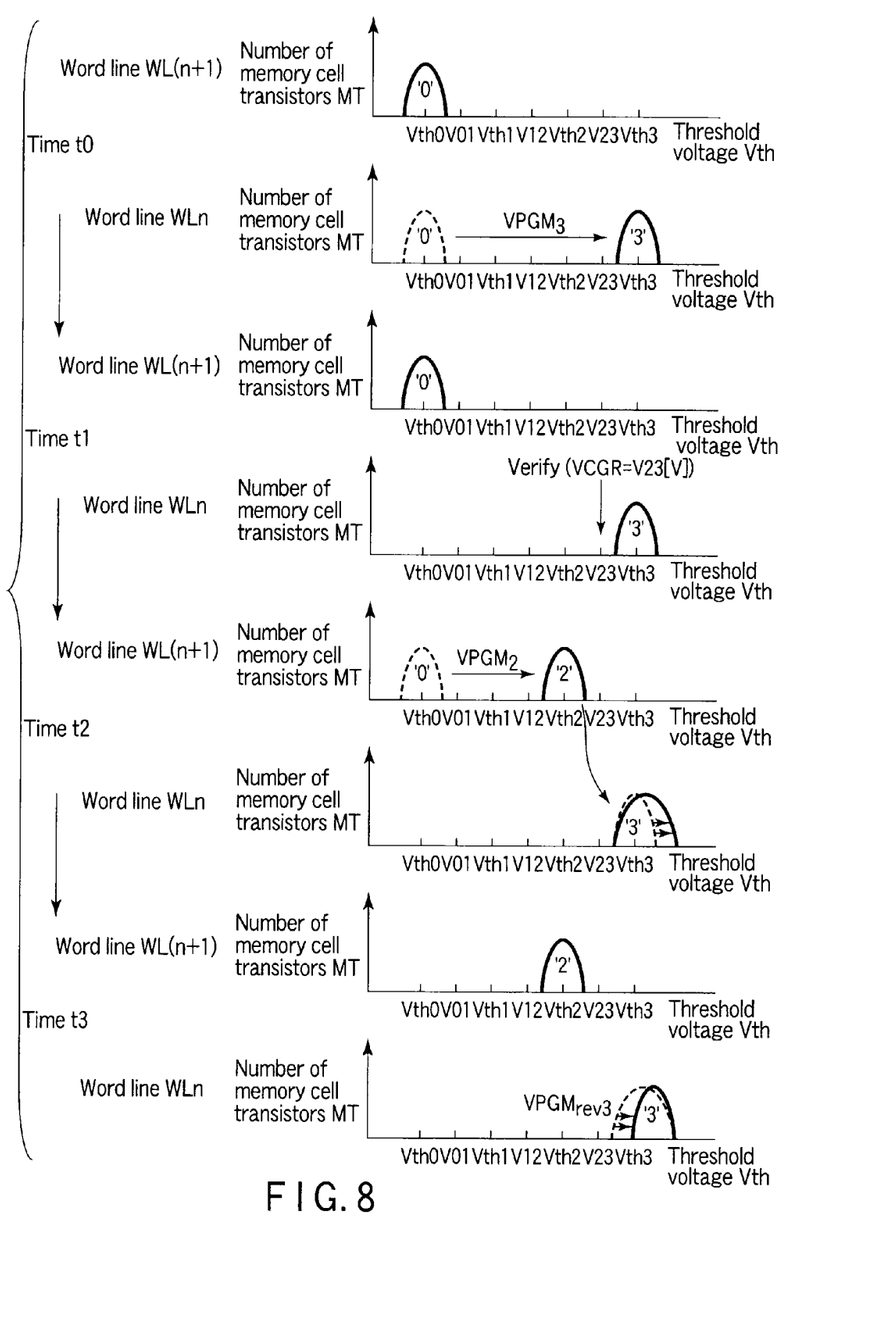
FIG. 8 is a time chart when writing "0" in the memory cell transistor MTn in the NAND flash memory according to the second embodiment.

Next, the write operation of the data to the memory cell transistor MT capable of holding the above-described multi-level data (for example, four-level data) is described with reference to FIG. 8. FIG. 8 is a time chart illustrating change in the threshold distribution of the memory cell transistors MT connected to the word line WLn and the word line WL (n+1) along with the time. FIG. 8 illustrates a state of writing the "3" data in FIG. 7, for example, in the memory cell transistor MT connected to the word line WLn. As in the above-described first embodiment, a case in which the "3" data is written in all of the memory cell transistors MT connected to the word line WLn is described.

Meanwhile, it is assumed that the "2" data in FIG. 7 is written in the memory cell transistor MT (n+1), for example. The voltage to write the "2" data in the memory cell transistor MT is set to the voltage $VPGM_2$ and the voltage to write the "3" data is set to the voltage $VPGM_3$ (>voltage $VPGM_2$>voltage $VPGM_0$). The voltage $VPGM_2$ is the voltage at which the threshold voltage of the memory cell transistor MT is higher than the voltage V12 and lower than the threshold Vth2 in FIG. 7. That is, the third voltage generator 63 adjusts the threshold voltage of the memory cell transistor MT by transferring the voltage higher than the voltage V12 but lower than the initial voltage in FIG. 7 to the memory cell transistor MT. This is also true for the voltage $VPGM_3$. That is, the voltage $VPGM_3$ is the voltage at which the threshold voltage of the memory cell transistor MT is higher than the voltage V23 and lower than the threshold Vth3 in FIG. 7. That is, the third voltage generator 63 adjusts the threshold voltage of the memory cell transistor MT by transferring the voltage higher than the voltage V23 but lower than the initial voltage in FIG. 7 to the memory cell transistor MT.

<Time t0>

First, when there is the write signal to the memory cell transistor MTn at the time t0 (S0, YES), the controller 3 controls the third voltage generator 63 and the driver circuit 7 to transfer the write voltage $VPGM_3$ to the word line WLn. According to this, the voltage $VPGM_3$ generated by the third voltage generator 63 is transferred to the word line WLn through the driver circuit 7 and the row decoder 5. The sense amplifier 4 keeps the potential of the bit line BLn at the write permission voltage, that is, 0 [V] based on the data supplied from the first page buffer 81. Also, the voltage VPASS is transferred to the non-selected word line WL by the fourth voltage generator 64. According to this, the voltage $VPGM_3$ is applied as the voltage difference to the control gate and the channel area of the memory cell transistor MTn, so that the "3" data is written in the memory cell transistor MTn (S1).
<Time t1>

Next, when there is the write signal to the memory cell transistor MT (n+1) at the time t1 (S2, YES), new data is stored in the first page buffer 81 from the host (not illustrated), and the controller 3 instructs the second voltage generator 62 and the driver circuit 7 to perform the write verify of the memory cell transistor MTn to which the writing is performed at the time t0. Then, the voltage VCGR generated by the second voltage generator 62 is transferred to the word line WLn through the driver circuit 7 and the row decoder 5. Herein, a value of the voltage VCGR generated by the second voltage generator 62 sequentially increases from 0 [V] by the limiter circuit 70 to take any of the values V01, V12, and V23 in FIG. 7, for example. In this case, the memory cell transistor MT is turned off even when the voltage VCGR is set to the voltage V23. According to this, the "3" data held by the read memory cell transistor MTn is transferred to the second page buffer 82.
<Time t2>

When the write verify to the memory cell transistor MTn is finished at the time t1, then the third voltage generator 63 transfers the write voltage $VPGM_2$ to the word line WL (n+1) at the time t2. The sense amplifier 4 keeps the potential of the bit line BLn at the write permission voltage, that is, 0 [V] based on the data held by the first page buffer 81 updated at the above-described time t1. According to this, the voltage difference of the voltage $VPGM_2$ is applied between the control gate and the channel area of the memory cell transistor MT (n+1). Therefore, the "2" data is written in the memory cell transistor MTn (S4). Then, especially the high-voltage side of the threshold distribution of the memory cell transistors MTn expands with the threshold variation of the memory cell transistor MT (n+1).
<Time t3>

Further, the controller 3 instructs, at the time t3, the third voltage generator 63 and the driver circuit 7 to transfer the rewrite voltage $VPGM_{rev3}$ in order to correct (narrow) the threshold distribution of the memory cell transistors MTn expanded at the time t2. Herein, since the threshold distribution of the memory cell transistors MTn is distributed on the positive side (S5, YES), the third voltage generator 63 transfers the rewrite voltage $VPGM_{rev3}$ higher than the verify point Vth23 in FIG. 7 (S7). Also, since the "0" data is stored in the first page buffer 81 as described above, the potential of the bit line BL is set to 0 [V] at the time of the rewriting.

Also, the second voltage generator 62 transfers the voltage Vth3 to the word line WLn, for example, as the voltage VCGR in order to perform the write verify. The threshold distribution of the memory cell transistors MT is corrected (narrowed) and when the threshold voltage of the memory cell transistor MT is higher than the voltage Vth3, the memory cell transistor MT is turned off. Then, the correction is completed.
<Effect According to this Embodiment>

With the semiconductor storage device and the method of controlling using the same according to this embodiment, a following effect (3) may be obtained.

(3) Operational Reliability May be Improved.

In the semiconductor storage device according to this embodiment, the data written in the memory cell transistor MTn is held by the second page buffer 82 as in the above-described first embodiment. Therefore, the third voltage generator 63 may generate the appropriate rewrite voltage VPGM according to the data. According to this, the effect not smaller than the above-described effect (1) may be expected when the data, which may be held by the memory cell transistor MT, is the four or more-level data. That is, since a voltage range of the data held by the memory cell transistor MT becomes narrower with the multi-level data, the adjustment of the voltage required to correct the expanded threshold distribution becomes difficult. However, with the semiconductor storage device according to this embodiment, the data held by the second page buffer 82 is the write data before the threshold distribution of the memory cell transistors MTn expands. That is, the controller 3 may control the third voltage generator 63 to transfer the appropriate voltage while referring to the held data. This is similar in the case of the four or more-level data. In this manner, the voltage generator 6 may transfer the voltage corresponding to the data, a plurality of which may be held, even after the expansion of the threshold distribution of the memory cell transistors MTn. Also, depending on the case, it may be expected that the above-described effects (1) and (2) are simultaneously obtained together with the effect (3).

Meanwhile, the sense amplifier 4 in which the collective reading or writing of the data to all of the bit lines BL in the write operation of the data is adopted has been described in the above-described first embodiment and this embodiment (second embodiment). However, one sense amplifier 4 may be connected to a plurality of (for example, two) bit lines BL. That is, the sense amplifier 4 may read and write the data by separating the data to an even-number bit and an odd-number bit. In this case also, the threshold distribution correction of the memory cell transistors MT may be performed by changing the operation sequence of the controller 3. Specifically, when focusing on the memory cell transistor MTn, there will be following two effects on the memory cell transistor MTn. A first effect is caused by the variation of the threshold distribution by the data writing to the memory cell transistor MT (n+1) arranged on the portion at which the word line WLn and the bit line BL (n+1) intersect with each other and adjacent to the memory cell transistor MTn. A second effect is caused by the variation of the threshold distribution by the data writing to the memory cell transistor MT (n+1) arranged on the portion at which the word line WL (n+1) and the bit line BLn intersect with each other and adjacent to the memory cell transistor MTn. To correct the threshold by the two effects, it is possible to hold the data of the memory cell transistor MT, which is not affected by the adjacent memory cell transistor MT and to which the writing is executed, by a plurality of buffers to transfer the appropriated voltage, for example, as in the above-described first and second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:

first and second memory cell each of which includes a charge accumulating layer and a control gate, and holds two or more-level data, the second memory cell being adjacent to the first memory cell;

a bit line transferring the data to the first memory cell and the second memory cell;

a first buffer which is connected to the bit line and holds write data to the first memory cell and the second memory cell;

a second buffer which is connected to the bit line and holds read data from the first memory cell; and a controller which controls first writing and rewriting executed for the first memory cell connected to the bit line and second writing executed for the second memory cell, wherein the write data in the first buffer is updated each time a second write signal is given, the controller executes the first writing based on the write data held by the first buffer, thereafter reads the data from the first memory cell when receiving the second write signal allows the second buffer to hold the read data, thereafter performs the second writing based on the write data updated in the first buffer, and then executes the rewriting to correct threshold distribution of the first memory cell based on the read data held by the second buffer.

2. The device according to claim 1, wherein the first memory cell is connected to the bit line through a current path of the second memory cell, and data writing is collectively performed for all the bit lines.

3. The device according to claim 1, wherein the controller includes a control circuit to which a control signal is supplied from an external terminal, and the control circuit issues a read signal of first data to the first memory cell when receiving the second write signal as the control signal.

4. The device according to claim 1, further comprising:

a voltage generator, wherein the voltage generator generates a first voltage corresponding to first data held by the first memory cell or a second voltage higher than the first voltage to correct the threshold distribution of the first memory cell.

5. The device according to claim 1, wherein the controller includes a control circuit to which a control signal is supplied from an external terminal, and the second write signal to the second memory cell and a read signal of first data to the first memory cell are supplied as control signals from the external terminal to the control circuit.

6. The device according to claim 4, wherein the first memory cell is arranged on a source side of the second memory cell, and a potential of the control gate of the first memory cell is set to the first voltage or the second voltage according to the first data held by the first memory cell at the time of the rewriting.

7. The device according to claim 4, wherein the charge accumulating layer of the first memory cell holds any one of a first charge amount and a second charge amount larger than the first charge amount by the first writing, as a result of the reading, the voltage generator generates the first voltage when the charge accumulating layer holds the first charge amount, and the voltage generator generates the second voltage when the charge accumulating layer holds the second charge amount.

8. The device according to claim 4, wherein the first memory cell takes any one of distributions of a first threshold voltage to a fourth threshold voltage separated from each other according to a charge amount held by the charge accumulating layer, as a result of the first writing, when the memory cell takes the third threshold voltage, the voltage generator generates a third voltage at the time of the rewriting, and as the result of the first writing, when the memory cell takes the fourth threshold voltage, the voltage generator generates a fourth voltage at the time of the rewriting.

9. The device according to claim 8, wherein the fourth voltage is higher than the third voltage.

10. The device according to claim 9, wherein when the values of the third voltage and the fourth voltage are the same, the voltage generator sets a length of time to transfer the fourth voltage to be larger than a length of time to transfer the third voltage.

* * * * *